(12) United States Patent
Ito et al.

(10) Patent No.: US 6,372,839 B1
(45) Date of Patent: Apr. 16, 2002

(54) FLIP-CHIP TYPE SEMICONDUCTOR DEVICE UNDERFILL

(75) Inventors: Kunio Ito; Toshio Shiobara; Kazuaki Sumita, all of Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 09/527,988

(22) Filed: Mar. 17, 2000

(30) Foreign Application Priority Data

Mar. 17, 1999 (JP) .......................................... 11-071378

(51) Int. Cl.⁷ ................................................. C08K 3/00
(52) U.S. Cl. ....................................... 524/493; 524/492
(58) Field of Search ................................. 524/493, 492

(56) References Cited

U.S. PATENT DOCUMENTS

| 4,999,699 A | | 3/1991 | Christie et al. |
| 5,064,881 A | * | 11/1991 | Togashi et al. ............. 523/443 |
| 5,089,440 A | | 2/1992 | Christie et al. |
| 5,292,688 A | | 3/1994 | Hsiao et al. |
| 5,928,595 A | | 7/1999 | Knapp et al. |

OTHER PUBLICATIONS

Publication No. JP 94033337 abstract only.

* cited by examiner

*Primary Examiner*—Edward J. Cain

(57) ABSTRACT

A composition comprising (A) a liquid epoxy resin, (B) spherical silica obtained by heating and burning spherical particles of polyorganosilsesquioxane, and (C) a curing accelerator is suitable as an underfill material for flip-chip type semiconductor devices. The composition has improved thin film infiltration and storage stability.

8 Claims, 1 Drawing Sheet

FLIP-CHIP TYPE SEMICONDUCTOR DEVICE UNDERFILL

This invention relates to underfill materials for flip-chip type semiconductor devices.

BACKGROUND OF THE INVENTION

With the advance of electric equipment toward smaller size, lighter weight and higher performance, the semiconductor mounting technology has changed from the pin mating type to the surface mounting which now becomes the mainstream. One bare chip mounting technology is flip-chip (FC) mounting. The flip-chip mounting is a technique of providing an LSI chip on its circuit pattern-bearing surface with several to several thousands of electrodes, known as bumps, of about 10 to 100 microns high and joining the chip to electrodes on a substrate with a conductive paste or solder. Then the sealing material used for the protection of FC devices must penetrate into gaps of several tens of microns defined by bumps between the substrate and the LSI chip. Conventional liquid epoxy resin compositions used as the underfill material for flip-chip devices are generally composed of a liquid epoxy resin, a curing agent and an inorganic filler. Of these, the most predominant is a composition in which a large amount of inorganic filler is blended in order to provide a matching coefficient of linear expansion with those of semiconductor chips, substrates and bumps for increased reliability.

With respect to stress properties, the flip-chip underfill materials with high loading of filler give rise to no problem. However, they suffer from very low productivity since they have a high viscosity due to the high filler loading so that they may penetrate into the gap between chip and substrate at a very slow rate. There is a desire to overcome this problem.

It is also known that when an underfill material is loaded with a large amount of inorganic filler, the particle size distribution and surface state of the filler largely affect the viscosity of the final product. Therefore, in the past, the filler is adjusted to an optimum particle size distribution, for example, by subjecting spherical silica (as produced by flame fusion) to air classification or sieving for removing coarse particles and fines therefrom, or by combining fractions of spherical silica having different particle sizes. Since the yields of these procedures are very low, the cost of raw material is increased.

It is also a common practice to treat the fillers, typically silica with surface modifiers such as silane coupling agents for improving the affinity of the silica surface to epoxy resins and hence, the bond strength therebetween. However, there arise a problem that even a minor amount of volatiles can cause to create voids since an underfill material is heat cured in a very narrow gap.

SUMMARY OF THE INVENTION

An object of the invention is to provide a flip-chip type semiconductor device underfilling material which maintains a low enough viscosity to ensure interstitial infiltration even when filled with a large amount of inorganic filler and which cures into a void-free, reliable product.

The invention is generally directed to an epoxy resin composition for use as an underfill material for flip-chip type semiconductor devices. It has been found that when spherical silica obtained by heating and burning spherical particles of polyorganosilsesquioxane, especially having a maximum particle size of up to 50 $\mu$m and a mean particle size of 0.5 to 10 $\mu$m and bearing carbon on the surface, is used as the inorganic filler, the resulting epoxy resin composition is improved in interstitial infiltration even when filled with a large amount of the inorganic filler. This is because the spherical silica defined above has an improved affinity to epoxy resins. As a result, semiconductor devices encapsulated with the composition are improved in reliability.

Accordingly, the invention provides an underfill material for flip-chip type semiconductor devices, comprising (A) 100 parts by weight of a liquid epoxy resin, (B) 100 to 300 parts by weight of spherical silica obtained by heating and burning spherical particles of polyorganosilsesquioxane, and (C) 0.01 to 10 parts by weight of a curing accelerator.

DESCRIPTION OF THE PREFERRED EMBODIMENTS

Figure 1:
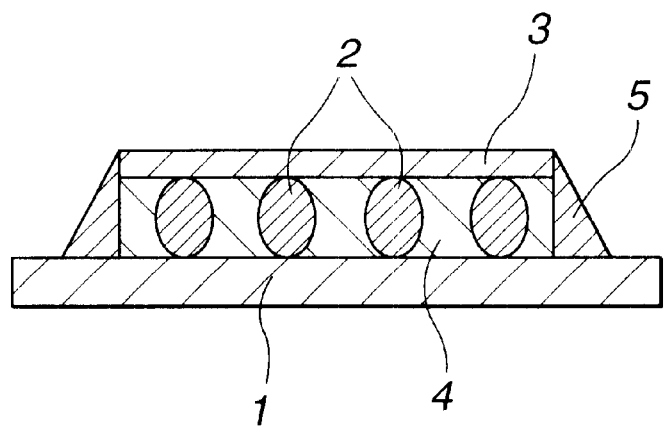
FIG. 1 is a schematic cross-sectional view of a flip-chip type semiconductor device.

In the epoxy resin composition providing a flip-chip type semiconductor device underfilling material according to the invention, the liquid epoxy resin used as component (A) may be any epoxy resin as long as it has at least two epoxy groups in a molecule. Preferred examples include bisphenol type epoxy resins such as bisphenol A type epoxy resins and bisphenol F type epoxy resins, novolac type epoxy resins such as phenol novolac type epoxy resins and cresol novolac type epoxy resins, triphenolalkane type epoxy resins such as triphenolmethane type epoxy resins and triphenolpropane type epoxy resins, naphthalene type epoxy resins, biphenyl type epoxy resins, and cyclopentadiene type epoxy resins. Of these, those epoxy resins which are liquid at room temperature are used, and especially, the bisphenol type epoxy resins such as bisphenol A type epoxy resins and bisphenol F type epoxy resins are desirable. Any of epoxy resins of the following structure may be added to the foregoing epoxy resins in such an amount as not to adversely affect the interstitial infiltration thereof.

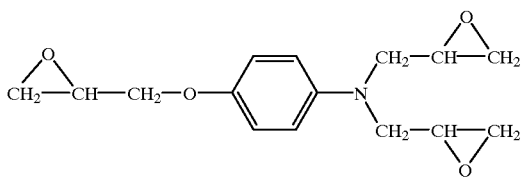

-continued

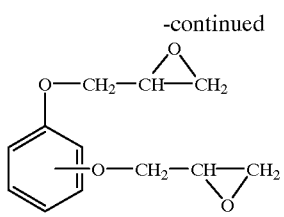

The liquid epoxy resins preferably have a total chlorine content of up to 1,500 ppm, and especially up to 1,000 ppm. When chlorine is extracted from the epoxy resin with water at an epoxy resin concentration of 50% and a temperature of 120° C. over a period of 20 hours, the water-extracted chlorine content is preferably up to 5 ppm. At a total chlorine content of greater than 1,500 ppm or a water-extracted chlorine level of more than 5 ppm, the semiconductor device would become less reliable, especially in the presence of moisture.

Component (B) is spherical silica obtained by heating and burning spherical particles of polyorganosilsesquioxane. Examples of the polyorganosilsesquioxanes include polyalkylsilsesquioxanes such as polyalkylsilsesquioxanes and polyethylsilsesquioxanes. Among them, polymethylsilsesquioxane spherical particles are preferably used.

The polyorganosilsesquioxane from which the spherical silica used herein is produced may be readily prepared by the method of JP-B 6-33337, for example. More particularly, the process starts with a trifunctional organoalkoxysilane typically a methyltrialkoxysilane such as methyltrimethoxysilane, methyltriethoxysilane or methyltripropoxysilane or a partial hydrolyzate thereof. With stirring, a mixture of the trifunctional organoalkoxysilane and an organic solvent is subject to hydrolytic condensation in an aqueous solution containing a base substance. The resulting spherical resin is neutralized. This process yields polyorganosilsesquioxane particles having a narrow particle size distribution. Examples of the trifunctional organoalkoxysilanes include trialkoxysilanes having a monovalent hydrocarbon group such as methyltrimethoxysilane, methyltriethoxysilane, methyltripropoxysilane, and those silanes in which methyl group of the above exemplified silanes is substituted by ethyl group, propyl group, butyl group or the other lower alkyl groups. Among them, alkyltrialkoxysilanes such as methyltrialkoxysilanes and ethyltrialkoxysilanes are preferred.

The polyorganosilsesquioxane particles preferably have a mean particle size of 0.5 to 10 μm, especially 1 to 5 μm and such a particle size distribution that those particles falling within the range of ±30% from the mean particle size account for at least 80% by weight. By burning the polyorganosilsesquioxane at a temperature of 400 to 1,000° C. for sintering, there is readily obtained spherical silica having substantially the same particle size distribution (including maximum and mean particle sizes) as the starting polyorganosilsesquioxane.

It is recommended that during the burning of polyorganosilsesquioxane in air, the quantity of oxygen is controlled to restrain oxidative decomposition of silicon-to-carbon bonds, allowing an appropriate minor amount of carbon to be left on the silica surface. The residual carbon on silica (filler) is effective for increasing the affinity between the liquid epoxy resin and the filler surface. The amount of carbon remaining on the silica surface is preferably. 0.005 to 0.1%, and more preferably 0.01 to 0.08% by weight based on the silica particles. Less than 0.005% of carbon may fail to impart a sufficient affinity whereas more than 0.1% of carbon leads to a larger amount of SiC so that the silica may become electrically conductive and unsuitable as an insulating material. Therefore, the use of silica with residual carbon even in a minor amount is preferred to silica completely free of carbon in that the carbon-bearing silica helps the resin penetrate quickly into narrow gaps in a flip-chip type semiconductor device. Nevertheless, silica completely free of carbon can be used herein as long as it is produced by the burning method and has a particle size distribution within the above-defined range.

The use of the silica spherical particles produced by the burning method and preferably bearing a specific amount of carbon ensures that cured products have properties comparable to the prior art products even when the amount of coupling agent is reduced from the conventional level. Then the formation of voids and other defects caused by volatiles is minimized, which in turn, ensures high reliability to semiconductor devices. Additionally, since the affinity of the filler to the resin is improved, the epoxy resin composition is reduced in viscosity to achieve both an improvement in interstitial infiltration and an increase in filler loading for reduced linear expansion.

In order to improve the infiltration capability, the silica particles should preferably have a mean particle size of less than about 1/10 and a maximum particle size of less than about 1/2 of the flip-chip gap width (that is the distance of the substrate-to-chip gap). Specifically, the silica particles have a maximum particle size of up to 50 μm, desirably up to 25 μm, more desirably up to 10 μm and a mean particle size of up to 10 μm (usually 0.5 to 10 μm), desirably up to 5 μm, more desirably 1 to 5 μm.

The spherical silica is blended in an amount of about 100 to 300 parts, desirably about 100 to 250 parts by weight per 100 parts by weight of the liquid epoxy resin. Smaller amounts of the filler would provide an epoxy resin composition with a greater coefficient of expansion so that cracks may be incurred in a thermal cycling test. An epoxy resin composition with excessive amounts of the filler would be too viscous, restraining its infiltration in thin film form.

It is noted that the amount of surface carbon on the spherical silica is measured by means of a carbon content analyzer in which the carbon dioxide gas generated by heating silica at 1300° C. is quantitatively determined. It is the amount of carbon present on surfaces of particles. The mean particle size as used herein can be determined, for example, as the weight average (or median diameter) in the particle size distribution as measured by the laser light diffraction method.

In addition to the spherical silica obtained by heating and burning spherical particles of polyorganosilsesquioxane, another inorganic filler may be compounded in the underfill material of the invention. Such inorganic fillers include silica powders such as spherical or pulverized fused silica, crystalline silica, and spherical silica obtained by the sol-gel method, alumina, boron nitride, aluminum nitride, silicon nitride, magnesia, and magnesium silicate, with the spherical fused silica being especially preferred. Like the spherical silica (B), the inorganic filler as the optional component should desirably have a maximum particle size of up to about 50 µm, more desirably up to about 25 µm, most desirably up to about 10 µm and a mean particle size of up to about 10 µm, typically about 0.5 to 10 µm, more desirably about 1 to 5 µm.

When the spherical silica (B) as the essential filler and the inorganic filler as the optional component are used together, the spherical silica (B) preferably accounts for at least 60% by weight (that is, 60 to 100% by weight), more preferably 65 to 99% by weight, and most preferably 80 to 99% by weight of the mixture of the spherical silica (B) and the inorganic filler.

Component (C) is a curing accelerator which may be selected from well-known ones. Use may be made of one or more curing accelerators selected from imidazole compounds, tertiary amine compounds and organic phosphorus compounds. Exemplary imidazole compounds are 2-methylimidazole, 2-ethylimidazole, 4-methylimidazole, 4-ethylimidazole, 2-phenylimidazole, 2-phenyl-4-methylimidazole, 2-phenyl-4-hydroxymethylimidazole, 2-ethyl-4-methylimidazole, 1-cyanoethyl-2-methylimidazole, 2-phenyl-4-methyl-5-hydroxymethylimidazole, and 2-phenyl-4,5-dihydroxymethylimidazole. Exemplary tertiary amine compounds are amine compounds having alkyl or aralkyl groups as the substituents attached to the nitrogen atom such as triethylamine, benzyltrimethylamine, and a-methylbenzyldimethylamine, cycloamidine compounds and salts thereof with organic acids such as 1,8-diazabicyclo [5.4.0] undecene-7 and the phenol salt, octylic salt and oleic salt thereof, and salts or complex salts between cycloamidine compounds and quaternary boron compounds, such as the compound of the following formula.

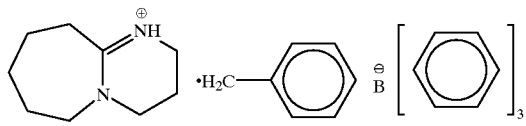

Exemplary organic phosphorus compounds are triorganophosphine compounds such as triphenylphosphine, and quaternary phosphonium salts such as tetraphenylphosphonium tetraphenylborate.

The curing accelerator is blended in an amount of about 0.01 to 10 parts, desirably about 0.5 to 5 parts by weight per 100 parts by weight of the liquid epoxy resin. Less than 0.01 part of the curing accelerator may not be effective for curing whereas more than 10 parts is effective for curing, but tends to detract from storage stability.

Although the epoxy resin can be cured with the curing accelerator alone, a curing agent is used if necessary. Typical curing agents include acid anhydrides of about 4 to 25 carbon atoms, preferably about 8 to 20 carbon atoms, having one or two aliphatic or aromatic rings and one or two acid anhydride groups in a molecule, such as tetrahydrophthalic anhydride, methyltetrahydrophthalic anhydride, methylhexahydrophthalic anhydride, hexahydrophthalic anhydride and methylhymic anhydride, pyromellitic dianhydride, benzophenonetetracarboxylic dianhydride, 3,3',4,4'-biphenyltetracarboxylic dianhydride, bis(3,4-dicarboxyphenyl)ether dianhydride, bis(3,4-dicarboxyphenyl)methane dianhydride, and 2,2-bis(3,4-dicarboxyphenyl)propane dianhydride. Also useful are carboxylic acid hydrazides such as dicyandiamide, adipic acid hydrazide and isophthalic acid hydrazide.

When the acid anhydride is used as the curing agent, it is desirably used in suc amounts that 0.3 to 0.7 mol of the acid anhydride group

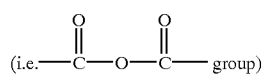

in the curing agent is available per mol of the epoxy group in the epoxy resin. Less than 0.3 mol of the acid anhydride group may be in-sufficient to cure the epoxy resin whereas more than 0.7 mol of the acid anhydride group may left behind unreacted acid anhydride, resulting in a decline of glass transition temperature. The more desirable amount is from 0.4 to 0.6 mol.

In the epoxy resin composition, silicone rubber, silicone oil, liquid polybutadiene rubber or a thermoplastic resin such as methyl methacrylate-butadiene-styrene copolymer may be blended for the purpose of stress reduction. The preferred stress reducing agent is a copolymer obtained through addition reaction between an epoxy or phenolic resin having alkenyl groups and an organopolysiloxane represented by the following average compositional formula (1) and having 20 to 400 silicon atoms, preferably 40 to 200 silicon atoms, and 1 to 5 SiH groups per molecule. The addition reaction takes place between alkenyl groups on the epoxy or phenolic resin and SiH groups on the organopolysiloxane.

$$H_a R_b SiO_{(4-a-b)/2} \qquad (1)$$

Herein R is a substituted or unsubstituted monovalent hydrocarbon group, a is a positive number of 0.005 to 0.1, b is a positive number of 1.8 to 2.2, and the sum of a and b is from 1.81 to 2.3 (i.e., $1.81 \leq a+b \leq 2.3$).

The monovalent hydrocarbon groups represented by R are preferably those of 1 to 10 carbon atoms, especially 1 to 8 carbon atoms, for example, alkyl groups such as methyl, ethyl, propyl, isopropyl, butyl, isobutyl, tert-butyl, hexyl, cyclohexyl, octyl, and decyl; alkenyl groups such as vinyl, allyl, propenyl, butenyl, and hexeny; aryl groups such as phenyl, xylyl and tolyl; and aralkyl groups such as benzyl, phenylethyl and phenylpropyl. Also included are halogen-substituted monovalent hydrocarbon groups wherein some or all of the hydrogen atoms in the foregoing hydrocarbon groups are replaced by halogen atoms such as chlorine, fluorine and bromine, for example, chloromethyl, bromoethyl and trifluoropropyl.

Among others, copolymers of the following structures are desirable.

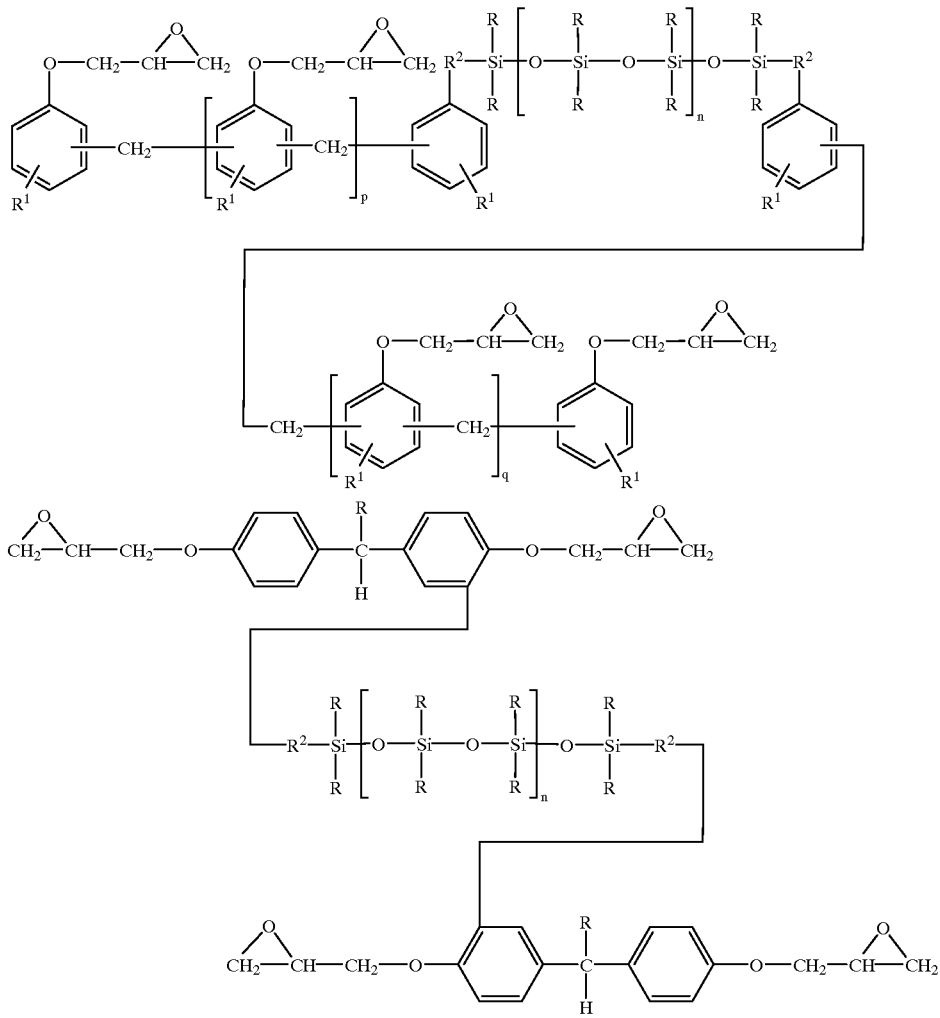

Herein, R is as defined above, $R^1$ is hydrogen or alkyl of 1 to 4 carbon atoms, $R^2$ is —CH$_2$CH$_2$CH$_2$—, —OCH$_2$—CH(OH)—CH$_2$—O—CH$_2$CH$_2$CH$_2$— or —O—CH$_2$CH$_2$CH$_2$—, letter n is an integer of 4 to 199, preferably 19 to 99, p is an integer of 1 to 10, and q is an integer of 1 to 10.

The copolymer is blended in such amounts that 0 to 20 parts, especially 2 to 15 parts by weight of the diorganopolysiloxane unit is available per 100 parts by weight of the epoxy resin and optional curing agent combined. Then the stress can be further reduced.

In the underfill material in the form of a liquid epoxy resin composition according to the invention, various other additives are blended if necessary. Such additives include carbon-functional silanes for improving tackiness, pigments (e.g., carbon black), dyestuffs, antioxidants, and surface treating agents (e.g., silane coupling agents such as γ-glycidoxypropyltrimethoxysilane).

The epoxy resin composition according to the invention can be prepared, for example, by simultaneously or separately agitating, dissolving, mixing and dispersing the epoxy resin, inorganic filler, curing accelerator, curing agent and other optional ingredients while heating if desired. The device for mixing, agitating and dispersing the ingredients is not critical although an attritor, three-roll mill, ball mill or planetary mixer each equipped with agitating and heating means is generally used. A suitable combination of these devices is also useful.

Since the liquid epoxy resin composition is used as an underfill material, that is, a sealing material in underfill areas, it should preferably have a viscosity of less than about 10,000 poises at 25° C. Also from the standpoints of interstitial infiltration and thermal impact resistance, the composition or underfill material should preferably have a coefficient of thermal expansion of 20 to 40 ppm/° C., and especially 20 to 30 ppm/° C. at temperatures below its glass transition temperature.

Referring to FIG. 1, a flip-chip type semiconductor device to which the underfill material of the invention is applicable is illustrated as comprising an organic substrate 1 having a wiring pattern-bearing surface (upper surface in the figure). A semiconductor chip 3 is mounted on the wiring pattern-bearing surface via a plurality of bumps 2 to define gaps between the substrate 1 and the semiconductor chip 3 and also between the bumps 2. The gaps are filled with an underfill material 4 and sealed along sides thereof with a fillet material 5.

Any of well-known sealing materials may be used as the fillet material although a liquid epoxy resin composition similar to the above-mentioned one may also be used. The inorganic fillers used in such compositions for the fillet include fused silica, crystalline silica, alumina, boron nitride, aluminum nitride, silicon nitride, magnesia, and magnesium silicate as well as the above-described spherical silica. The liquid epoxy resin composition for the fillet should preferably have a coefficient of thermal expansion of up to 20 ppm/° C., more preferably 5 to 19 ppm/° C., and most preferably 10 to 18 ppm/° C. at temperatures below its glass transition temperature.

A conventional method and conditions may be employed in molding or forming the underfill material. Preferably, it is molded and cured at 150° C. for at least ½ hour using a heating oven.

EXAMPLE

Examples of the invention are given below by way of illustration and not by way of limitation.

Examples 1–6 and Comparative Examples 1–2

Eight epoxy resin compositions were prepared by uniformly milling the components shown in Tables 1 and 2 in a three-roll mill. The following tests were carried out on these epoxy resin compositions. The results are also shown in Tables 1 and 2.

Viscosity

Using a BH type rotating viscometer, a viscosity at 25° C. was measured at 20 rpm.

Thixotropy

Using a BH type rotating viscometer, a viscosity at 25° C. was measured at 2 rpm and 20 rpm. Thixotropy is the viscosity at 2 rpm divided by the viscosity at 20 rpm.

Gelling Time

The time passed until the composition gelled on a hot plate at 150° C. was measured.

Glass Transition Temperature (Tg)

Using a thermomechanical analyzer (TMA), glass transition was observed while heating a cured sample of 5 mm×5 mm×15 mm at a rate of 5° C./min.

CTE-1: a coefficient of thermal expansion at temperatures below Tg.

CTE-2: a coefficient of thermal expansion at temperatures above Tg.

In the above measurement of Tg, CTE-1 was determined in the temperature range of 50 to 80° C. and CTE-2 was determined in the temperature range of 200 to 230° C.

Figure 2A:
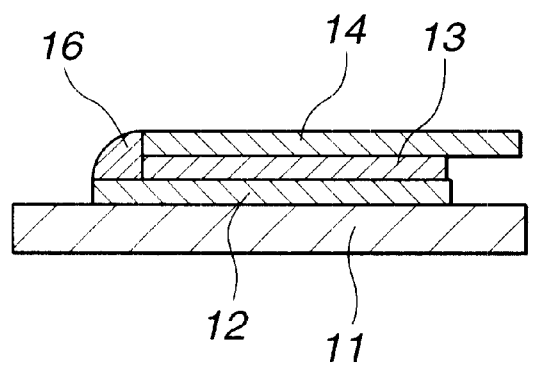
FIG. 2 illustrates a test piece used in an infiltration test, FIG. 2A being a side view and FIG. 2B being a plan view.
Figure 2B:
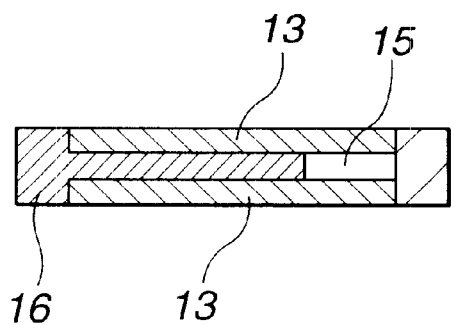

Infiltration Test As shown in FIGS. 2A and 2B, a lower slide glass plate 12 was rested on a hot plate 11. A pair of 80-micron polyimide films 13 and 13 laterally spaced 1 cm from each other were set on the glass plate 12. An upper slide glass plate 14 was rested thereon. The slide glass plates 12, 14 defined with the two polyimide films 13, 13 an elongated space 15 having a width of 1 cm and a height of 80 μm. A mass of epoxy resin composition 16 was placed on the lower slide glass plate 12 at one end of the space 15. With this setting, the hot plate 11 was heated at 100° C. whereupon the epoxy resin composition 16 infiltrated through the space 15. The infiltration time was measured until the composition 16 infiltrated and reached a distance of 20 mm from the one end of the space 15.

Void Detection by Ultrasonic Flaw Detector A silicon chip of 10 mm×10 mm having 400 bumps was rested on a BT substrate. The assembly was held for 2 hours in an atmosphere of 23° C. and RH 60%. Using a dispenser, an epoxy resin composition was applied to one side of the assembly to seal the underfill area therewith. After the underfill was heat cured, internal voids were detected by means of an ultrasonic flaw detector. A percent void is calculated as the total area of voids divided by the sealing area of the cured underfill.

Thermal Shock Test

An epoxy resin composition was uniformly applied to a copper frame. A silicon wafer cut to 10 mm×10 mm and having a thickness of 0.6 mm was rested on the resin. The resin was cured at 150° C. for 4 hours. The thus obtained test piece was subjected to thermal cycling between −55° C. for 1 min and 160° C. for 30 sec. The test piece was observed after 100 cycles. Those samples whose cured resin cracked or separated were rejected. A percent rejection was calculated as a percentage of rejected samples per 20 samples.

TABLE 1

| | | E1 | E2 | E3 | E4 | E5 | E6 |
|---|---|---|---|---|---|---|---|
| Components (parts by weight) | RE310 | 100 | — | 50 | 100 | — | 50 |
| | RE304 | — | 100 | — | — | 100 | — |
| | MH700 | — | — | 40 | — | — | 40 |
| | Silica A | 150 | — | 250 | — | 100 | 200 |
| | Silica B | — | 150 | — | — | — | — |
| | Silica C | — | — | — | 200 | — | — |
| | Silica D | — | — | — | — | — | — |
| | Silica E | — | — | — | — | — | — |
| | Silica F | — | — | — | — | 50 | 50 |
| | KBM403 | 0.2 | 0.3 | 0.3 | 0.3 | 0.3 | 0.3 |
| | 2P4MZ | 1.5 | 1.5 | — | 1.5 | 1.5 | — |
| | HX3741 | — | — | 5 | — | — | 5 |
| Characteristics | Viscosity (poise/25° C.) | 480 | 350 | 330 | 750 | 490 | 360 |
| | Thixotropy | 1.01 | 1.01 | 1.00 | 1.01 | 1.01 | 1.01 |
| | Gelling time (sec/150° C.) | 60 | 65 | 70 | 62 | 62 | 68 |
| | Tg (° C.) | 135 | 135 | 145 | 140 | 136 | 145 |
| | CTE-1 (ppm/° C.) | 32 | 31 | 25 | 27 | 31 | 26 |
| | CTE-2 (ppm/° C.) | 84 | 82 | 77 | 78 | 83 | 78 |
| | Infiltration time (sec/100° C.) | 180 | 140 | 90 | 240 | 190 | 100 |

TABLE 1-continued

|  | E1 | E2 | E3 | E4 | E5 | E6 |
|---|---|---|---|---|---|---|
| Reject (%) in thermal shock test | 0 | 0 | 10 | 0 | 0 | 0 |
| Voids (%) | 0 | 0 | 0 | 0 | 0 | 0 |

TABLE 2

| | | CE1 | CE2 |
|---|---|---|---|
| Components (parts by weight) | RE310 | 100 | 50 |
| | RE304 | — | — |
| | MH700 | — | 40 |
| | Silica A | — | — |

(4) Silica shown in Table 3

(5) KBM403: γ-glycidoxypropyltrimethoxysilane by Shin-Etsu Chemical Co., Ltd.

(6) 2P4MZ: 2-phenyl-4-methylimidazole by Shikoku Chemicals K.K.

(7) HX3741: microcapsulated catalyst containing an imidazole compound by Asahi-Ciba K.K.

TABLE 3

| Silica No. | Preparation method | Maximum particle size (μm) | Mean particle size (μm) | Carbon content (wt %) | Specific surface area (m²/g) | Remarks |
|---|---|---|---|---|---|---|
| A | burning of polymethylsilsesquioxane (800° C./6 hr) | 16 | 3.5 | 0.03 | 1.8 | particles sized 2.45–4.55 μm account for 90% |
| B | burning of polymethylsilsesquioxane (900° C./5 hr) | 10 | 2.5 | 0.01 | 1.9 | particles sized 1.75–3.25 μm account for 85% |
| C | burning of polymethylsilsesquioxane (800° C./3 hr) | 10 | 1.5 | 0.07 | 2.3 | particles sized 1.01–1.95 μm account for 88% |
| D | classification of flame fused particles | 30 | 3.5 | 0 | 1.9 | particles sized 2.45–4.55 μm account for 68% |
| E | classification of flame fused particles | 15 | 1.8 | 0 | 2.9 | particles sized 1.26–2.34 μm account for 56% |
| F* | classification of flame fused particles | 10 | 1.5 | 0 | 2.2 | particles sized 1.75–3.25 μm account for 85% |

*SO32H manufactured by Admatechs Co., Ltd.

TABLE 2-continued

| | | CE1 | CE2 |
|---|---|---|---|
| | Silica B | — | — |
| | Silica C | — | — |
| | Silica D | — | 250 |
| | Silica E | 200 | — |
| | KBM403 | 0.3 | 0.3 |
| | 2P4MZ | 1.5 | — |
| | HX3741 | — | 5 |
| Characteristics | Viscosity (poise/25° C.) | 1200 | 550 |
| | Thixotropy | 1.02 | 1.08 |
| | Gelling time (sec/150° C.) | 63 | 70 |
| | Tg (° C.) | 138 | 145 |
| | CTE-1 (ppm/° C.) | 26 | 25 |
| | CTE-2 (ppm/° C.) | 76 | 78 |
| | Infiltration time (sec/100° C.) | Short of 20 mm | Short of 20 mm |
| | Reject (%) in thermal shock test | 25 | 50 |
| | Voids (%) | 0 | 5 |

Note:
(1) RE310: bisphenol A type epoxy resin by Nippon Kayaku K.K.
(2) RE304: bisphenol F type epoxy resin by Nippon Kayaku K.K.
(3) MH700: methyltetrahydrophthalic anhydride by Shin-Nippon Rika K.K.

There has been described a flip-chip type semiconductor device underfilling material having an improved thin-film infiltration capability and storage stability. The flip-chip type semiconductor device sealed therewith remains highly reliable.

Japanese Patent Application No. 11-071378 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. An underfill material for flip-chip type semiconductor devices, comprising (A) 100 parts by weight of a liquid epoxy resin, (B) 100 to 300 parts by weight of spherical silica obtained by heating and burning spherical particles of polyorganosilsesquioxane, said spherical silica particles having a maximum particle size of up to 50 μm and a mean particle size of 0.5 to 10 μm and bearing 0.005 to 0.1% by weight of carbon on their surface, and (C) 0.01 to 10 parts by weight of a curing accelerator.

2. The underfill material of claim 1, wherein a second inorganic filler is compounded in addition to the spherical silica (B), and the spherical silica (B) accounts for at least 60% by weight of the mixture of the spherical silica (B) and the second inorganic filler.

3. The underfill material of claim 2, wherein the second inorganic filler has a maximum particle size of up to 50 μm and a mean particle size of up to about 10 μm.

4. The underfill material of claim 1, wherein the liquid epoxy resin has a total chlorine content of up to 1500 ppm.

5. The underfill material of claim 1, wherein the polyorganosilsesquioxane is a polymethylsilsesquioxane.

6. The underfill material of claim 1, wherein the polyorganosilsesquioxane particles have a mean particle size of 1 to 5 μm.

7. The underfill material of claim 1, wherein the polyorganosilsesquioxane particles bear 0.01 to 0.08% by weight of carbon on their surface.

8. The underfill material of claim 1, wherein the silica particles have a mean particle size of less than about 1/10 and a maximum particle size of less than about 1/2 of the flip-chip gap width.

* * * * *